(12) United States Patent
Zheng et al.

(10) Patent No.: US 10,292,302 B2
(45) Date of Patent: May 14, 2019

(54) REMOTE RADIO UNIT AND ACTIVE ANTENNA SYSTEM

(71) Applicant: Huawei Technologies Co., Ltd., Shenzhen (CN)

(72) Inventors: Yong Zheng, Shenzhen (CN); Bin Wang, Shenzhen (CN); Fei Bian, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/487,885

(22) Filed: Apr. 14, 2017

(65) Prior Publication Data

US 2017/0223868 A1    Aug. 3, 2017

Related U.S. Application Data

(63) Continuation of application No. PCT/CN2015/077817, filed on Apr. 29, 2015.

(30) Foreign Application Priority Data

Oct. 16, 2014    (CN) .......................... 2014 1 0546715

(51) Int. Cl.
*H01Q 1/24*    (2006.01)
*H05K 7/20*    (2006.01)
(Continued)

(52) U.S. Cl.
CPC .......... *H05K 7/20145* (2013.01); *H01Q 1/002* (2013.01); *H01Q 1/02* (2013.01);
(Continued)

(58) Field of Classification Search
CPC .... H05K 7/20145; H01Q 1/241; H01Q 1/002; H01Q 1/421; H01Q 1/02
(Continued)

(56) References Cited

U.S. PATENT DOCUMENTS 6,430,042 B1    8/2002    Ohashi et al.
8,537,059 B2 *    9/2013    Sauer .................. H01Q 1/02
                                                                343/705

(Continued)

FOREIGN PATENT DOCUMENTS

CN    101662317 A    3/2010
CN    201718149 U    1/2011
(Continued)

*Primary Examiner* — Jean B Jeanglaude
(74) *Attorney, Agent, or Firm* — Leydig, Voit & Mayer, Ltd.

(57) ABSTRACT

A remote radio unit, which includes a housing, a ventilation air channel, and a circuit component, where the housing is a sealed hollow cavity; the ventilation air channel passes through the housing, a top end of the ventilation air channel is connected to a top end surface of the housing in a sealed manner, and a bottom end of the ventilation air channel is connected to a bottom end surface of the housing in a sealed manner; and the circuit component is disposed inside the cavity, and is in contact with an external surface of a side wall of the ventilation air channel, so that heat generated by the circuit component is dissipated through the ventilation air channel.

10 Claims, 4 Drawing Sheets

(51) Int. Cl.
*H01Q 1/00* (2006.01)
*H01Q 1/02* (2006.01)
*H01Q 1/42* (2006.01)

(52) U.S. Cl.
CPC ............... *H01Q 1/241* (2013.01); *H01Q 1/42* (2013.01); *H01Q 1/421* (2013.01); *H05K 7/20163* (2013.01)

(58) Field of Classification Search
USPC .................................................. 343/705, 702
See application file for complete search history.

(56) References Cited

U.S. PATENT DOCUMENTS

| | | | |
|---|---|---|---|
| 2012/0222444 A1* | 9/2012 | Li | F28D 15/0233 62/259.2 |
| 2013/0299125 A1* | 11/2013 | Shi | H01L 23/467 165/47 |
| 2013/0343110 A1 | 12/2013 | Liu | |
| 2015/0382504 A1 | 12/2015 | Hu et al. | |

FOREIGN PATENT DOCUMENTS

| | | | |
|---|---|---|---|
| CN | 102355149 A | | 2/2012 |
| CN | 102984831 A | | 3/2013 |
| CN | 202818833 U | | 3/2013 |
| CN | 103717036 A | | 4/2014 |
| EP | 2955985 | * | 10/2013 |

* cited by examiner

REMOTE RADIO UNIT AND ACTIVE ANTENNA SYSTEM

CROSS-REFERENCE TO RELATED APPLICATIONS

This application is a continuation of International Application No. PCT/CN2015/077817 filed on Apr. 29, 2015, which claims priority to Chinese Patent Application No. 201410546715.7 filed on Oct. 16, 2014. The disclosures of the aforementioned applications are hereby incorporated by reference in their entireties.

TECHNICAL FIELD

Embodiments of the present invention relate to the communications field, and in particular, to a remote radio unit and an active antenna system.

BACKGROUND

An active antenna system (AAS, Active Antenna System) is a 3rd generation base station antenna system, and is a directional antenna technology integrating a remote radio unit (RRU, Remote Radio Unit) and an antenna unit. The remote radio unit (RRU, Radio Remote Unit) can, at a far end, convert an optical signal from a base band unit (BBU, Base Band Unit) into a radio frequency signal and perform amplification.

In a process of converting an optical signal into a radio frequency signal and performing amplification, a circuit component of the RRU may generate a large quantity of heat, which causes an excessively high temperature of the RRU. The excessively high temperature of the RRU not only affects normal operation of the RRU, but also affects a service life of the RRU. In order to improve a heat dissipation capability of the RRU and prevent the excessively high temperature of the RRU, a common method in the prior art is to dispose a radiator on a housing of the RRU, or design a housing of the RRU to be in a shape that facilitates heat dissipation, so that heat generated by the circuit component is dissipated through the housing of the RRU.

However, no matter whether a radiator is disposed on a housing of the RRU or a housing of the RRU is designed to be in a shape that facilitates heat dissipation, particular heat dissipation space needs to be reserved between different RRUs and between an RRU and a surrounding object to ensure a heat dissipation capability of the RRU. When a distance between RRUs or between an RRU and a surrounding object is closer, the heat dissipation capability of the RRU is degraded due to insufficient heat dissipation space. Therefore, it can be seen that a heat dissipation capability of an RRU in the prior art is unstable and is prone to being affected by a size of heat dissipation space.

SUMMARY

Embodiments of the present invention provide a remote radio unit and an active antenna system, so as to resolve a problem that a heat dissipation capability of a remote radio unit in the prior art is unstable and is prone to being affected by a size of heat dissipation space.

According to a first aspect, an embodiment of the present invention provides a remote radio unit, where the remote radio unit includes a housing, a ventilation air channel, and a circuit component, where the housing is a sealed hollow cavity; the ventilation air channel passes through the housing, a top end of the ventilation air channel is connected to a top end surface of the housing in a sealed manner, and a bottom end of the ventilation air channel is connected to a bottom end surface of the housing in a sealed manner; and the circuit component is disposed inside the cavity, and is in contact with an external surface of a side wall of the ventilation air channel, so that heat generated by the circuit component is dissipated through the ventilation air channel.

With reference to the first aspect, in a first possible implementation manner of the first aspect, the remote radio unit further includes an active radiator, where the active radiator is disposed at a port of the ventilation channel, or the active radiator is disposed inside the ventilation channel, so as to improve a heat dissipation capability of the ventilation air channel.

With reference to the first possible implementation manner of the first aspect, in a second possible implementation manner of the first aspect, the active radiator is a fan, and the fan is disposed at a bottom end port of the ventilation air channel, so that wind generated by the fan flows into the ventilation air channel from the bottom end port of the ventilation air channel, and flows out of the ventilation air channel from a top end port of the ventilation air channel.

With reference to the first aspect, the first possible implementation manner of the first aspect, or the second possible implementation manner of the first aspect, in a third possible implementation manner of the first aspect, the remote radio unit further includes a heat sink fin, where the heat sink fin is disposed on an internal surface of the side wall of the ventilation air channel.

With reference to the first aspect or one of the first to third possible implementation manners of the first aspect, in a fourth possible implementation manner of the first aspect, the remote radio unit further includes a spacer sealed at the top end port of the ventilation air channel, where the spacer is disposed with air ventilating holes, so that wind, flowing into the top end port of the ventilation air channel, in the ventilation channel flows out of the ventilation air channel through the air ventilating holes.

With reference to the first aspect or one of the first to fourth possible implementation manners of the first aspect, in a fifth possible implementation manner of the first aspect, the remote radio unit further includes a cable exit mechanism, where the cable exit mechanism includes a first cable connector disposed on the bottom end surface of the housing, and a second cable connector disposed on the top end surface of the housing; the first cable connector is configured to implement a coupling between the circuit component and a base band unit BBU; and the second connector is configured to implement a coupling between the circuit component and an antenna element.

With reference to the first aspect or one of the first to fifth possible implementation manners of the first aspect, in a sixth possible implementation manner of the first aspect, the remote radio unit further includes a sliding slot and a slide fitting to the sliding slot, where that the ventilation air channel passes through the housing is implemented by fitting the sliding slot to the slide; and the sliding slot is disposed on the internal surface of the side wall of the housing, and the slide is disposed on the external surface of the side wall of the ventilation air channel; or the slide is disposed on the internal surface of the side wall of the housing, and the sliding slot is disposed on the external surface of the side wall of the ventilation air channel.

According to a second aspect, an embodiment of the present invention provides an active antenna system, where the active antenna system includes the remote radio unit according to the first aspect and the implementation manners of the first aspect, and an antenna unit, where the antenna unit includes an antenna element; the antenna unit is fastened on a top end surface of the remote radio unit; and the antenna element of the antenna unit is coupled with a circuit board of the remote radio unit.

With reference to the second aspect, in a first possible implementation manner of the second aspect, the antenna unit further includes a radome, where the radome includes an external radome and an internal radome; the internal radome is disposed inside the external radome, and an air deflection cavity is formed between the external radome and the internal radome; the internal radome is connected to the external radome through an air deflection board, and the air deflection board is disposed with air deflection holes; and the air deflection cavity is connected to a ventilation air channel of the remote radio unit, so that after flowing out of the ventilation air channel from a top end port of the ventilation air channel, wind generated by a fan flows into the air deflection cavity and then flows out of the air deflection cavity through the air deflection holes.

With reference to the first possible implementation manner of the second aspect, in a second possible implementation manner of the second aspect, the internal radome is a sealed hollow cavity, including an internal radome side wall, an internal radome top surface and an air director, where the internal radome side wall is of a tubular structure, the internal radome top surface and the air director are sealed at two ends of the internal radome side wall, and the internal radome is configured to accommodate the antenna element.

The RRU in the embodiments of the present invention includes a housing, a ventilation air channel, and a circuit component, where the housing is a sealed hollow cavity; the ventilation air channel passes through the housing, a top end of the ventilation air channel is connected to a top end surface of the housing in a sealed manner, and a bottom end of the ventilation air channel is connected to a bottom end surface of the housing in a sealed manner; and the circuit component is disposed inside the cavity, and is in contact with an external surface of a side wall of the ventilation air channel, so that heat generated by the circuit component is dissipated through the ventilation air channel. Compared with the prior art, the RRU in the present invention performs heat dissipation mainly through a ventilation air channel, and has a stable heat dissipation capability. Moreover, because the ventilation air channel is disposed inside the RRU, a heat dissipation capability of the RRU is not related to a size of heat dissipation space, and is not affected by the size of the heat dissipation space.

BRIEF DESCRIPTION OF DRAWINGS

To describe the technical solutions in the embodiments of the present invention more clearly, the following briefly describes the accompanying drawings required for describing the embodiments. Apparently, a person of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
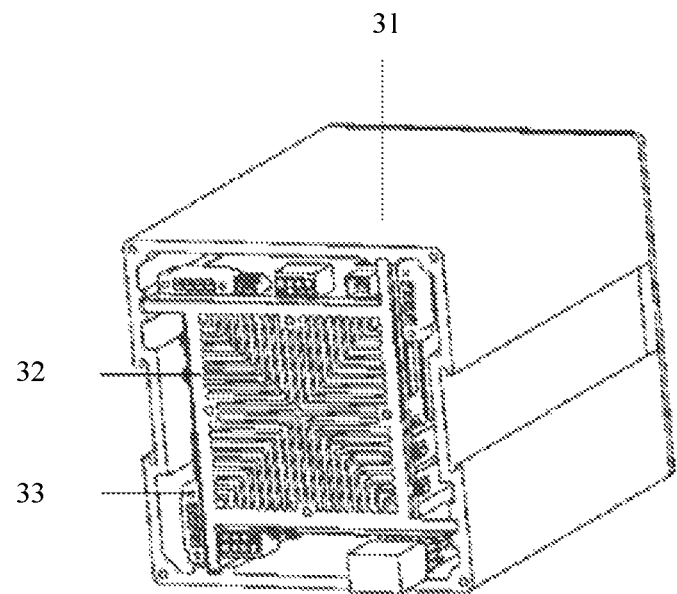
FIG. 1 is a schematic diagram of a cross section of a remote radio unit according to the present invention.

FIG. 1 is a schematic diagram of a cross section of a remote radio unit according to the present invention. As shown in FIG. 1, the remote radio unit 3 includes a housing 31, a ventilation air channel 32, and a circuit component 33 disposed inside the housing. The housing 31 is a sealed hollow cavity; the ventilation air channel 32 passes through the housing 31; the circuit component 33 is disposed inside the cavity, and is in contact with an external surface of a side wall of the ventilation air channel 32, so that heat generated by the circuit component is dissipated through the ventilation air channel.

Figure 2:
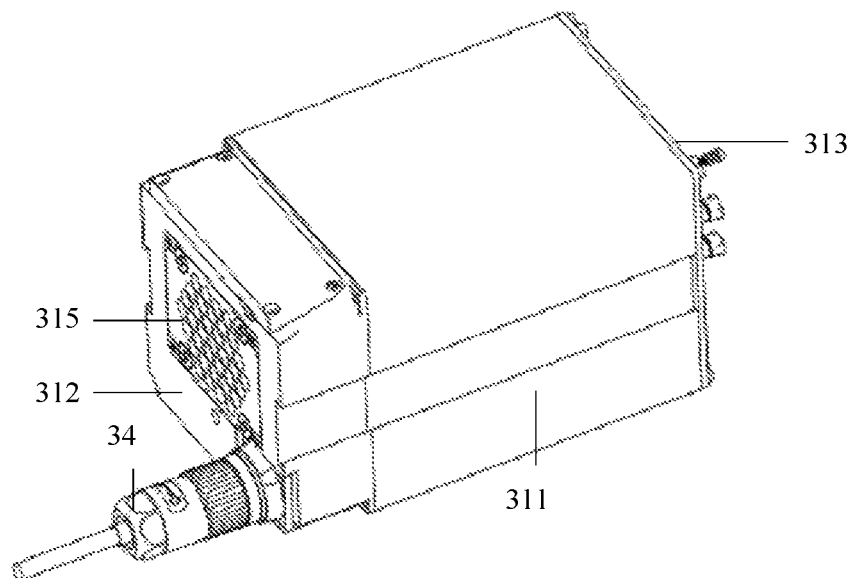
FIG. 2 is a schematic diagram of an outline of a remote radio unit according to the present invention.

FIG. 2 is a schematic diagram of an external shape of a remote radio unit according to the present invention. As shown in FIG. 2, the housing 31 is a sealed hollow cavity. The housing 31 may include a side wall 311, a bottom end surface 312, and a top end surface 313. The side wall 311 may be of a regular-shape hollow tubular cavity structure. The top end surface 313 is sealed at one end of a tubular cavity formed by the side wall 311. The bottom end surface 312 is sealed at the other end of the tubular cavity formed by the side wall 311. A top end of the ventilation air channel 32 is connected to the top end surface 313 in a sealed manner, and a bottom end of the ventilation air channel 32 is connected to the bottom end surface 312 in a sealed manner.

The ventilation air channel 32 passes through the housing 31. An external wall surface of the top end of the ventilation air channel 32 is connected to the top end surface 313 in a sealed manner, and an external wall surface of the bottom end of the ventilation air channel 32 is connected to the bottom end surface 312 in a sealed manner, that is, the housing 31 and the ventilation air channel 32 form a ring-shape sealed accommodation cavity that is configured to accommodate the circuit component 33. A surface on which the side wall of the ventilation air channel 32 is exposed to the sealed accommodation cavity is an external surface, that is, an external wall surface; a surface on which the side wall of the ventilation air channel 32 is exposed to the outside is an internal surface, that is, an internal wall surface. In contrast, a surface on which the side wall 311 is exposed to the sealed accommodation cavity is an internal surface, and a surface on which the side wall 311 is exposed to the outside is an external surface.

The circuit component 33 may be a printed circuit board, an integrated circuit, or a like form, and carry an electronic element implementing a remote radio function. The circuit component 33 is in contact with the external wall surface of the ventilation air channel 32, and is fastened on the external wall surface of the ventilation air channel 32.

Figure 3:
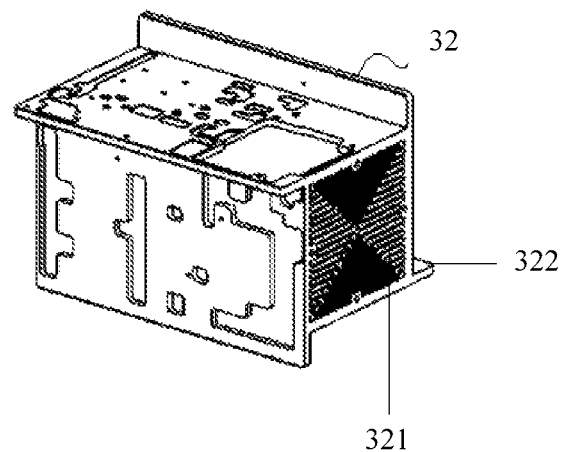
FIG. 3 is a schematic diagram of a structure of a ventilation air channel of a remote radio unit according to the present invention.

FIG. 3 is a schematic structural diagram of the ventilation air channel 32. As shown in FIG. 3, the ventilation air channel 32 may be of a channel structure including a plurality of curved heat dissipation walls or planar heat dissipation walls, where the channel is connected to the outside as an air channel, and there may be one or more channels. Heat generated by the circuit component 33 is dissipated through the ventilation air channel 32. A shape of the ventilation air channel 32 may be set as needed, for example, may be a channel with a regular-shape structure such as a triangular column, a circular column, or a square column. The internal wall surface of the ventilation air channel 32 is used to dissipate heat. In order to facilitate the circuit component 33 fully laminating with an external wall surface of the ventilation air channel 32, and implement a better heat dissipation effect, an avoidance area fitting to a shape of an electronic component may be further disposed on the external wall surface of the ventilation air channel 32. In order to facilitate fastening the circuit component 33 on the external wall surface, the external wall surface of the ventilation air channel 32 may be further disposed with screw holes, so that the circuit component 33 may be tightly fastened on the external wall surface of the ventilation air channel 32 by installing screws.

Figure 4:
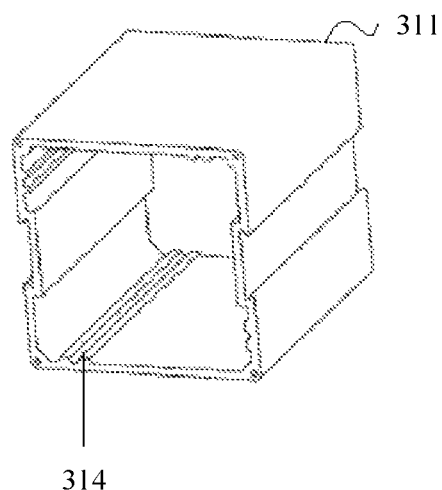
FIG. 4 is a schematic diagram of a side wall structure of a housing of a remote radio unit according to the present invention.

FIG. 4 is a schematic structural diagram of a side wall 311 of a housing 31. As shown in FIG. 4, the side wall 311 is of a hollow tubular structure. Because a shape of the side wall 311 determines a shape of an AAS, in order to implement a regular permutation of the AAS, the side wall 311 may be a circular tube, a rhombic tube, a rectangular tube, or the like. A sliding slot 314 may be disposed on the internal wall surface of the side wall 311. Correspondingly, as shown in FIG. 3, a slide 322 fitting to the sliding slot may be disposed on the external wall surface of the ventilation air channel 32, so that the slide 322 of the ventilation air channel 32 may be inserted into a cavity of the side wall 311 along the sliding slot 314 and fastened on an internal wall of the side wall 311, so as to implement, by fitting the sliding slot 314 to the slide 322, that the ventilation air channel passes through the housing. Moreover, by fitting the slide and the sliding slot, a relative position between the side wall 311 and the ventilation air channel 32 may be further fastened, thereby preventing an extrusion on the circuit component 33 due to a relative movement of the side wall 311 and the ventilation air channel 32. Quantities and shapes of the slide and the sliding slot may be set according to the shape of the side wall 311 and the shape of the ventilation air channel 32. Alternatively, a slide may be further disposed on an internal wall of the side wall 311, and a sliding slot fitting to the slide for sliding may be disposed on the external wall surface of the ventilation air channel 32.

In order to enhance a heat dissipation capability of the ventilation air channel 32, a radiator connected with the ventilation air channel 32 may be further disposed on the RRU. The radiator may include an active radiator, or may include a passive radiator. The passive radiator may include a heat sink fin, a heat sink, or the like. The active radiator may include an air cooling radiator, a water cooling radiator, a liquid cooling radiator, a heat pipe radiator, a semiconductor refrigeration chip radiator, a compressor-assisted radiator, a liquid nitrogen radiator, or the like. In actual use, both the active radiator and the passive radiator may be disposed, where the passive radiator may be disposed on the internal wall surface of the ventilation air channel 32, and the active radiator may be disposed at a port of the ventilation air channel 32.

As shown in FIG. 3, the passive radiator such as a heat sink fin 321 may be further disposed on the internal wall surface of the ventilation air channel 32. A length, a quantity, a disposing density and the like of the heat sink fin 321 may be set as needed.

Figure 5:
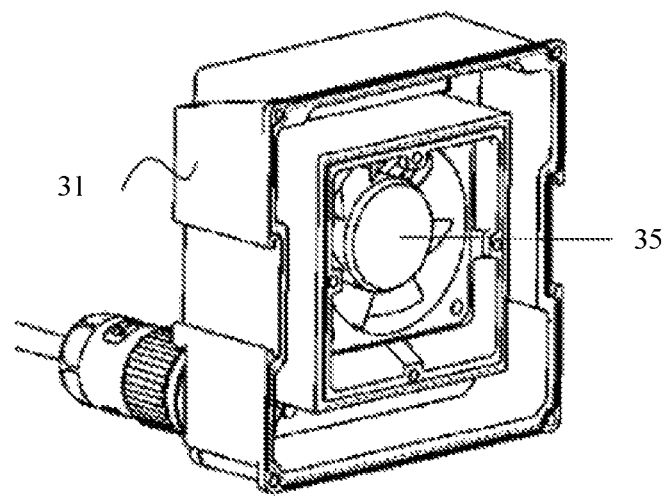
FIG. 5 is a schematic diagram of another cross section of a remote radio unit according to the present invention.

FIG. 5 is a schematic diagram of another cross section of a remote radio unit according to the present invention. As shown in FIG. 5, the active radiator may be a fan 35, where the fan 35 is disposed at a bottom end port of the ventilation air channel 32, so that wind generated when the fan runs flows into the ventilation air channel from the bottom end port of the ventilation air channel 32, and flows out of the ventilation air channel from a top end port of the ventilation air channel 32, so as to enhance a heat dissipation capability of the remote radio unit 3.

In order to facilitate disposing the fan 35, the bottom end surface 312 may be indented to form a radiator cavity that is used to dispose radiators such as a fan, where the radiator cavity is connected to the ventilation air channel 32. The fan 35 is disposed inside the radiator cavity, and the fan is covered at the bottom end port of the ventilation air channel 32; and the housing 31 provides a support, a fastening, and protection for the active radiator. As shown in FIG. 2, an opening of the radiator cavity may be further sealed by a fan cover 315 to prevent fan blades from hurting hands, so as to improve fan security.

The housing 31 may be disposed with one or more cable exit mechanisms that are configured to couple the circuit component 33 with another unit, a BBU, a power supply device of AAS. The cable exit mechanism may include a first cable connector disposed on the bottom end surface 312 of the housing, and a second cable connector disposed on the top end surface 313 of the housing. Both the first cable connector and the second connector may be waterproof cable connectors. As shown in FIG. 2, the first cable connector includes a waterproof optical fiber connector 34. The waterproof optical fiber connector 34 may be vertically disposed on the bottom end surface 312, and passes through the bottom end surface 312 to couple with the circuit component 33, so that the remote radio unit 3 performs data transmission with a BBU by using an optical fiber. The second cable connector may be further disposed on the top end surface 313; and the second cable connector is configured to implement a coupling between the circuit component 33 and an antenna element. An indented cable entry maintaining cavity may be further disposed on the housing 31, and a waterproof cable outlet may be further disposed inside the cable entry maintaining cavity. A cable, such as a power cable, connecting with the circuit component 33 may pass through, via the waterproof cable outlet, a sealed hollow cavity formed by the ventilation air channel 32 and the housing 31, thereby implementing water proof while implementing cable exit.

Compared with the prior art, an RRU in this embodiment performs heat dissipation mainly through a ventilation air channel, and has a stable heat dissipation capability. Because the ventilation air channel is disposed inside the RRU; and a heat dissipation capability of the RRU is not related to a size of heat dissipation space, and is not affected by the size of the heat dissipation space. Moreover, chimney effect generated by the ventilation air channel may further enhance a heat dissipation capability of the ventilation air channel.

Figure 6:
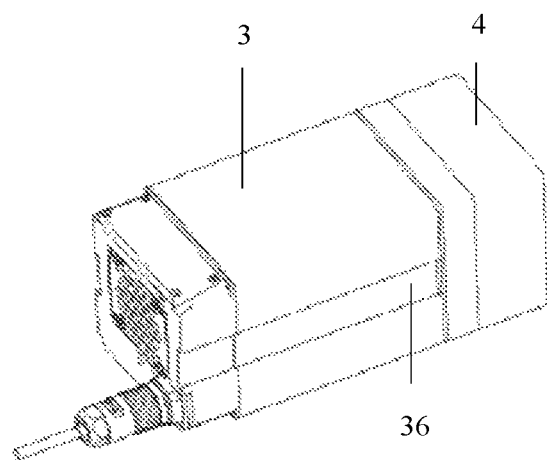
FIG. 6 is a schematic diagram of an outline of an AAS according to the present invention.

Refer to FIG. 6, which is a schematic diagram of an embodiment of an AAS according to the present invention.

As shown in FIG. 6, the AAS includes a remote radio unit 3 and an antenna unit 4, where the antenna unit 4 includes an antenna element, and the antenna element of the antenna unit 4 is coupled with a circuit board of the remote radio unit 3. An antenna may be fastened on a top end surface 313 of a housing 31 of the remote radio unit 3. The antenna unit 4 and a shape of the remote radio unit 3 are matched, so that the antenna unit 4 may cover on the top end surface 313 of the housing 31, and that a channel of the ventilation air channel 32 is connected to the outside.

Figure 7:
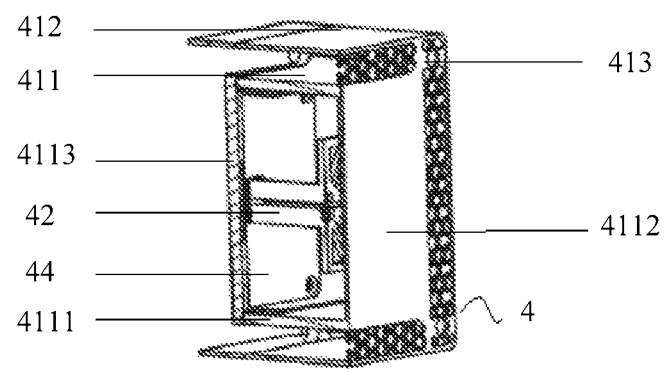
FIG. 7 is a schematic structural diagram of a longitudinal section of an antenna unit of an AAS according to the present invention.

FIG. 7 is a schematic diagram of a longitudinal section of an antenna unit. As shown in FIG. 7, in addition to an antenna element 42, the antenna unit 4 may include a radome 41. The antenna element is fastened inside the radome 41. The radome 41 provides protection for the antenna element 42, and implements isolation between the antenna element 42 and the outside.

As shown in FIG. 7, the radome 41 may include an internal radome 411 and an external radome 412.

The external radome 412 is of a hollow tubular cavity structure; the internal radome 411 is disposed inside the hollow tubular cavity; and an air deflection cavity is formed between the external radome 412 and the internal radome 411, so as to improve a heat dissipation capability of the ventilation air channel. The internal radome 411 may be connected to the external radome 412 through an air deflection board 413, where the air deflection board is disposed with air deflection holes. The air deflection cavity is connected to the ventilation air channel of the remote radio unit, so that wind flowing into the air deflection cavity from the ventilation air channel flows out of the air deflection cavity through the air deflection holes.

The internal radome 411 is a sealed hollow cavity, including a tube-shaped internal radome side wall 4111, an internal radome top surface 4112 and an air director 4113. The internal radome top surface 4112 and the air director 4113 are sealed at two ends of the internal radome side wall 4111. The internal radome is configured to accommodate the antenna element. An antenna reflection panel may be disposed on the air director 4113 in a tile manner. The antenna element 42 may be vertically disposed on the antenna reflection panel 44, and vertically disposed on the air director 4113.

In order to facilitate a coupling between the antenna element 42 and a circuit component 33 to implement signal transmission, a cable exit mechanism, for example, a waterproof cable outlet, may be disposed on the air director 4113 or the internal radome side wall 4111. A data transmission cable between the antenna element 42 and the circuit component 33 may be connected to the antenna element 42 and the circuit component 33 by using the cable exit mechanism disposed on the air director 4113 or the internal radome 411 and a second cable connector disposed on the top end surface.

An external wall of a side wall 311 may be further disposed with a fastening device, so as to fasten the AAS. As shown in FIG. 6, the fastening device may be one or more grooves 36 as holders. A style of the groove 36 may be a dovetail groove, connecting a top end surface of the side wall and a bottom end surface of the side wall. When using the AAS to establish an antenna array, the remote radio unit may be fastened on a pole through the groove 36, so as to fasten the AAS on the pole.

Compared with the prior art, an AAS in this embodiment performs heat dissipation mainly through a ventilation air channel of an RRU. Because the ventilation air channel is disposed inside the RRU, a heat dissipation capability of the RRU is stable, and is not affected by a distance between AASs or between the AAS and a surrounding object. Moreover, chimney effect generated by the ventilation air channel may further enhance a heat dissipation capability of the ventilation air channel.

A person skilled in the art may clearly understand that the technologies in the embodiments of the present invention may be implemented by software in addition to a necessary general hardware platform. Based on such an understanding, the technical solutions in the embodiments of the present invention essentially or the part contributing to the prior art may be implemented in a form of a software product. The computer software product may be stored in a storage medium, such as a ROM/RAM, a hard disk, or an optical disc, and includes several instructions for instructing a computer device (which may be a personal computer, a server, a network device, or the like) to perform the methods described in the embodiments or some parts of the embodiments of the present invention.

The embodiments in this specification are all described in a progressive manner. For same or similar parts in the embodiments, reference may be made to these embodiments, and each embodiment focuses on a difference from other embodiments. Especially, a system embodiment is basically similar to a method embodiment, and therefore is described briefly. For related parts, reference may be made to partial descriptions in the method embodiment.

The foregoing descriptions are implementation manners of the present invention, but are not intended to limit the protection scope of the present invention. Any modification, equivalent replacement, and improvement made without departing from the spirit and principle of the present invention shall fall within the protection scope of the present invention.

What is claimed is:

1. A remote radio unit, comprising:
   a housing, a ventilation air channel and a circuit component, wherein
   the housing is a cavity;
   the ventilation air channel passes through the housing, a top end of the ventilation air channel is connected to a top end surface of the housing in a sealed manner, and a bottom end of the ventilation air channel is connected to a bottom end surface of the housing in a sealed manner; and
   the circuit component is disposed inside the cavity, and is in contact with an external surface of a side wall of the ventilation air channel, wherein heat generated by the circuit component is dissipated through the ventilation air channel.

2. The remote radio unit according to claim 1, further comprising an active radiator, wherein
   the active radiator is disposed at a port of the ventilation air channel, or the active radiator is disposed inside the ventilation air channel, so as to improve a heat dissipation capability of the ventilation air channel.

3. The remote radio unit according to claim 2, wherein
   the active radiator includes a fan, and the fan is disposed at a bottom end port of the ventilation air channel, wherein wind generated by the fan flows into the ventilation air channel at the bottom end port of the ventilation air channel, and flows out of the ventilation air channel at a top end port of the ventilation air channel.

4. The remote radio unit according to claim 1, further comprising a heat sink fin, wherein the heat sink fin is disposed on an internal surface of the side wall of the ventilation air channel.

5. The remote radio unit according to claim 1, further comprising a spacer shielded at a top end port of the ventilation air channel, wherein the spacer includes air ventilating holes, so that wind, flowing into the top end port of the ventilation air channel, and within the ventilation channel, flows out of the ventilation air channel through the air ventilating holes.

6. The remote radio unit according to claim 1, further comprising a cable exit mechanism, wherein
the cable exit mechanism comprises a first cable connector disposed on the bottom end surface of the housing, and a second cable connector disposed on the top end surface of the housing; the first cable connector is configured to couple the circuit component and a base band unit (BBU); and the second connector is configured to couple the circuit component and an antenna element.

7. The remote radio unit according to claim 1, further comprising:
a sliding slot and a slide fitting to the sliding slot, wherein that the ventilation air channel passes through the housing is implemented by fitting the sliding slot to the slide; and
the sliding slot is disposed on an internal surface of the side wall of the housing, and the slide is disposed on the external surface of the side wall of the ventilation air channel; or
the slide is disposed on the internal surface of the side wall of the housing, and the sliding slot is disposed on the external surface of the side wall of the ventilation air channel.

8. An active antenna system (AAS), comprising:
a remote radio unit, the remote radio unit including:
a housing, a ventilation air channel and a circuit component, wherein
the housing is a cavity;
the ventilation air channel passes through the housing, a top end of the ventilation air channel is connected to a top end surface of the housing in a sealed manner, and a bottom end of the ventilation air channel is connected to a bottom end surface of the housing in a sealed manner; and
the circuit component is disposed inside the cavity, and is in contact with an external surface of a side wall of the ventilation air channel, wherein heat generated by the circuit component is dissipated through the ventilation air channel; and
an antenna unit, wherein the antenna unit comprises an antenna element; and the antenna unit is fastened on the top end surface of the housing of the remote radio unit, and the antenna element of the antenna unit is coupled with a circuit board of the remote radio unit.

9. The AAS according to claim 8, wherein
the antenna unit further comprises a radome, wherein
the radome comprises an external radome and an internal radome, the internal radome is disposed inside the external radome, and an air deflection cavity is formed between the external radome and the internal radome;
the internal radome is connected to the external radome through an air deflection board, and the air deflection board includes air deflection holes; and
the air deflection cavity is connected to the ventilation air channel of the remote radio unit, wherein after flowing out of the ventilation air channel from a top end port of the ventilation air channel, wind generated by a fan flows into the air deflection cavity and then flows out of the air deflection cavity through the air deflection holes.

10. The AAS according to claim 9, wherein
the internal radome is a sealed hollow cavity, comprising an internal radome side wall, an internal radome top surface and an air director, wherein the internal radome side wall has a tubular structure, the internal radome top surface and the air director are sealed at two ends of the internal radome side wall, and the internal radome is configured to accommodate the antenna element.

* * * * *